United States Patent [19]
Adair et al.

[11] Patent Number: 5,501,877
[45] Date of Patent: Mar. 26, 1996

[54] PATTERNED DEPOSITION OF THIN FILMS

[75] Inventors: James H. Adair; Rajiv K. Singh; William R. Eisenstadt, all of Gainesville, Fla.; Sherry S. Staehle, Ballwin, Mo.

[73] Assignee: University of Florida, Gainesville, Fla.

[21] Appl. No.: 308,156

[22] Filed: Sep. 19, 1994

[51] Int. Cl.⁶ .................................................. C23C 16/00
[52] U.S. Cl. .................. 427/249; 427/259; 427/282; 427/299; 423/446
[58] Field of Search .................... 427/249, 259, 427/282, 299; 423/446

[56] References Cited

U.S. PATENT DOCUMENTS

| | | | |
|---|---|---|---|
| 5,082,359 | 1/1992 | Kirkpatrick | 427/307 |
| 5,082,522 | 1/1992 | Purdes et al. | 423/446 |
| 5,204,210 | 4/1993 | Jansen et al. | 427/249 |

Primary Examiner—Shrive Beck
Assistant Examiner—David M. Maiorana
Attorney, Agent, or Firm—Thomas C. Saitta

[57] ABSTRACT

A method for creating a patterned thin film of a high surface energy material on a substrate comprising the steps of creating a photomask pattern on the substrate using photolithography, providing an oppositely charged surface on the substrate and photomask, if such does not exist, from that of particles of the high surface energy material, removing the photomask and exposing the substrate to an aqueous colloidal suspension of particles composed of the high surface energy material to adsorb seed particles onto the surface of the substrate, or removing the photomask after adsorbing seed particles to the surface, and then depositing a uniform thin film of the high surface energy material by chemical vapor deposition onto the seeded substrate.

24 Claims, 2 Drawing Sheets

5,501,877

PATTERNED DEPOSITION OF THIN FILMS

BACKGROUND OF THE INVENTION

The invention relates generally to an improved method for creating patterned films on substrates. More particularly, the invention relates to an improved method for creating patterned films of diamond or similar material on substrates using chemical vapor deposition (CVD). CVD patterning of the diamond or other material is accomplished by first creating patterns on the substrate using photolithography or other masking techniques, followed by depositing seed particles onto a suitably charged surface using colloidal suspension techniques.

Material properties in various applications can be improved by the application of film coatings having superior properties relative to the substrate material. Some of the better film materials are difficult to apply however, since creation of some of the most stable film surfaces require large amounts of energy. One technique for creating films of high surface energy materials, such as carbides, nitrides, borides, and oxides including lead, zirconate titanate, etc., is the known technique of chemical vapor deposition. One of the most desirable coatings is that of diamond, due to its superior properties related to high hardness, low coefficient of friction, high thermal conductivity, heat and corrosion resistance, etc. Applications in which diamond coatings are useful include wear surfaces such as cutting tools, heat sinks for electronic devices, microwave power devices, electro-optical devices, etc. However, application of diamond films, even via the CVD technique, is difficult because of the nature of the material itself.

Most CVD techniques currently employed to create diamond films on a substrate require the substrate surface to be damaged in some manner. For example, it is known to improve CVD of diamond by polishing or scratching the substrate surface, ultrasonicating the surface in a diamond suspension, or etching the surface with plasma. Obviously, damage to the surface of the substrate is not desirable in many applications, such as when the substrate is a silicon wafer to be used in microelectronics. Films created by these techniques are typically patchy and non-uniform with many areas of the substrate remaining uncovered. Patterning of the film is usually not obtainable or is inefficient as the preparation techniques usually damage the substrate. Valdes et al. has reported a non-damaging electrophoretic technique for depositing patterned diamond in "Selected Area Nucleation and Patterning of Diamond Thin Films by Electrophoretic Seeding" (*J. Electrochem. Soc.*, 138, 635–636 (1991). This technique utilizes an electric field to cause deposition from a colloidal suspension of diamond seeds onto a substrate, which is then treated via conventional CVD to grow a diamond film. This technique results in better coverage, but is limited in that it requires a conductive substrate.

The method of the invention is a non-damaging technique utilizing photolithography and conventional CVD for growth of patterned diamond films or the like on substrates of any composition, e.g., plastic, glass, metal or ceramic. The method results in rapid, uniform growth of a patterned film, with the ability to control grain size. The method is successful on substrates of any surface configuration, whether electrically conductive or non-conductive. Film growth is several times faster than under the known techniques.

SUMMARY OF THE INVENTION

The invention is a method for creating patterned thin films on substrates using photolithography or other masking techniques and chemical vapor deposition (CVD). The method comprises creating a photomask pattern on the substrate, adsorbing seed particles of the film material from a colloidal suspension onto the substrate, followed by CVD to create a thin film on the selected areas. For ease of discussion, the invention will be disclosed mainly with reference to diamond film, but it is to be understood that the method is applicable to any high surface energy material capable of film formation through CVD techniques on a substrate, such as carbides, nitrides, borides or certain oxides.

A substrate of any material or configuration is first cleansed. A photomask pattern is created on the substrate surface using standard photolithography such that certain areas of the substrate are exposed during the colloidal suspension seeding step, while other areas are covered by the removable mask.

The basis for the seeding technique is that particles of opposite charge to that of the substrate are used. Collisions of particles in the colloidal suspension onto the oppositely charged substrate surface result in electrostatic bonding of the fine particles to the substrate. For example, it has been established that commercially available diamond particles are negatively charged in water from at least pH 2 to pH 11. In the case of silicon wafers, the native silicon dioxide surface layer also imparts a negative surface charge over a similar pH range. Thus, to ensure that the negatively charged diamond particles adhere to the silicon wafer, the wafer is treated with a surface active agent whose adsorption imparts a positive surface charge to the silicon surface. In contrast, substrates with positively charged surfaces do not require a surface treatment to impart a positive charge. Therefore, the diamond particles with negatively charged surfaces interact directly with the positively charged substrate surfaces and a preliminary surface treatment is not required. Likewise, for particles with positive charges, such as lead titanate or aluminum oxide, a negatively charged substrate such as silicon needs no surface treatment, while a positively charged substrate would require treatment with an anionic polymer, such as ammonium polymethacrylate.

After the desired charge is established on the surface of the masked substrate, the mask may be removed. This results in defined areas receptive to the colloidal diamond suspension with other others being not receptive, i.e., not correctly charged. In the alternative, the mask may be maintained in place during the colloidal seeding step and removed after that step and prior to the CVD step. For substrates which do not require surface charge treatment prior to the colloidal seeding step, the mask must be left in place during seeding.

The substrate is rinsed and submerged in an aqueous suspension of diamond powder, the diamond particles having a diameter of less than 10 microns. The negatively charged diamond particles are adsorbed onto the positively charged substrate surface. The density of the particles adsorbed onto the surface is controlled by varying the concentration of particles in the aqueous solution or the exposure time in the suspension. The substrate is removed and rinsed. The diamond particles adsorbed on the substrate surface act as seeds for growth of the diamond film, which is formed on the substrate surface using conventional CVD techniques. The result is a uniform, patterned film on the substrate—the diamond film growing only in those areas which were not covered by the photomask during the surface charge treatment step or the colloidal suspension treatment stop.

DETAILED DESCRIPTION OF THE INVENTION

Figure 1:
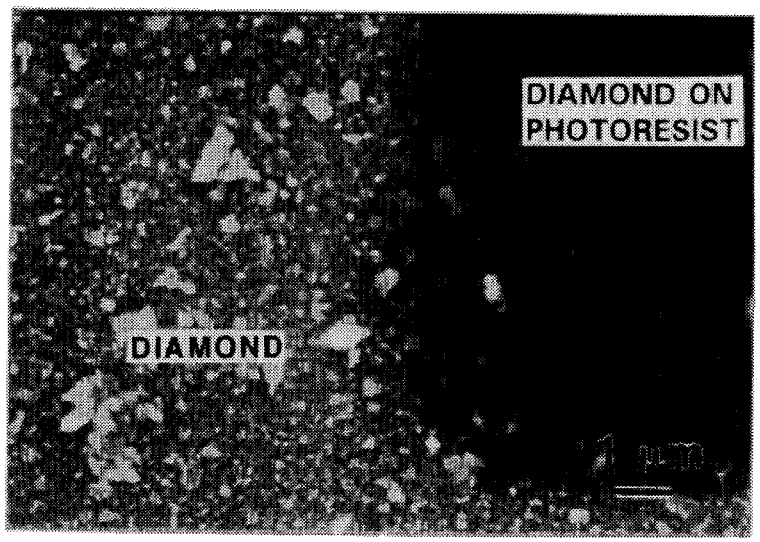
FIG. 1 is a scanning electron microscope (SEM) photomicrograph of a diamond seeded, photoresist coated silicon

The method is an improved chemical vapor deposition (CVD) technique which comprises steps involving photomasking a pattern onto a substrate, adsorption of seed particles of the film material onto the substrate (treated to alter surface charge if necessary), followed by conventional CVD to form a patterned film on the substrate. The seeding method is not restricted to any particular substrate compositions or configurations. The seeding method has been utilized on substrates of plastic, glass, ceramic and metal, with configurations ranging from planar to tubular. CVD is used to create films of materials having high surface energies, i.e., those where a large amount of energy is required to create the highly stable films. Materials having surfaces energies of greater than 60 ergs/cm$^2$ are defined in the art as being high surface energy materials. The method is suitable for many high surface energy materials, such as many carbides, nitrides, borides or oxides containing lead, zirconate titanate or the like. In particular the technique is applicable for the creation of diamond films on substrates. For ease of discussion and because diamond films have wide applicability because of their inherent desirable characteristics, the method shall be disclosed mainly with reference to the creation of a diamond film on a silicon wafer substrate, although it is to be understood that the disclosure is applicable to the numerous film materials and substrates mentioned above.

A commercially obtained silicon wafer is first cleansed of contaminants by a solvent rinse, e.g., a first rinse of acetone followed by a rinse of isopropanol, or any other suitable solvents. Standard photolithography is used to create a pattern on the substrate. For example, a commercial photoresist is applied to the surface of the substrate and baked on, the photoresist is exposed through a mask to ultraviolet light to create a pattern, then developed.

It is necessary for the methodology that the surface of the substrate have opposite surface charge to that of the particles. Since diamond particles are inherently negatively charged, a positive charge must be imparted to the surface of the silicon wafer and the photoresist. While the negative charge on the particles could be reversed, it is more efficient to change the surface polarity of the substrate. A positive surface charge on the silicon wafer can be created by treating the substrate with cations or positively charged cationic polymers. The latter is preferred because anions that accompany the cation such as chloride or nitrate, if not removed, may compromise the chemical vapor deposition of the desired material as these are considered contaminants to the material. The positively charged species, as either ions or polyelectrolytes, are strongly attracted and chemically adsorbed to the negatively charged silicon surface because of the large attractive electrostatic forces between the negatively charged silicon substrate and the positively charged chemical species. Preferably, a highly branched polymer, such as polyethyleneimine, is used, as it has been found that these polymers adsorb in a flat conformation on the substrate surface with excellent overall surface coverage. Additionally, all of the monomer units of polyethyleneimine are positively charged over a pH range below pH 9.5 to 10, thereby maximizing the number of adsorption sites for the negatively charged diamond particles. Furthermore, it has been found that once the polyethyleneimine is adsorbed to a silicon surface, the polymer molecules are so strongly bound to the surface that the adsorbed polyethyleneimine molecules are not removed by rigorous washing with deionized water. For a silicon wafer, a solution of 1 to 10 volume percent of polyethyleneimine in water is prepared and the wafer allowed to soak for approximately 2 minutes or more, followed by a rinse with deionized water.

An aqueous suspension of diamond particles is prepared using commercially available diamond powders having particle sizes of less that 10 microns, with preferable particle size being in the area of 0.1 to 0.2 microns. Optimally, the solution is approximately 0.05 to 5.0 volume percent particles in water. Since the larger particles tend to settle rather than become suspended in the solution it is preferred to decant the solution to insure that only fine particles are present. The treated substrate with a positively charged surface is now suspended into the aqueous diamond solution at ambient temperature for a period of time from 30 seconds to 24 hours or more. The negatively charged diamond particles adsorb onto the positively charged adsorption sites of the polymer on the surface of the photoresist coated, silicon substrate, creating a large number of individual seeding sites for diamond film growth. The density of the individual diamond particle seeds is a function of the concentration of the aqueous solution, a high concentration resulting in high seed density and a low concentration resulting in low seed density on the surface of the substrate. The density of the seed particles in turn determines the grain size of the final diamond film, smaller grains resulting from high seed density and larger grains resulting from low seed density. The thickness of the seed layer is a function of the orientation of the substrate during exposure. A vertical surface tends to limit itself to a relatively thin layer of 0.1 microns or less, depending on the size of the diamond particles, while a horizontal surface may attain a relatively thick layer up to 100 microns in depth. After sufficient exposure to the diamond colloidal solution, the substrate is removed and rinsed with deionized water to remove any loose diamond particles. If a thick layer is desired, the substrate is allowed to evaporate dry rather than being rinsed.

At this point the cross-linked photoresist is preferably removed from the substrate surface by rinsing with a suitable solvent. This removes the diamond seed particles which were on the cross-linked photoresist portions from the surface of the silicon substrate, resulting in a patterned substrate with well defined areas of diamond seeds on the remaining photoresist in contrast with well defined areas of exposed silicon substrate with no diamond seeds. Alternatively, the photoresist can be allowed to remain on the substrate during the CVD step. This results in a complete film coating after the CVD step. Removal of the cross-linked photoresist then provides a patterned diamond film on the substrate.

Next, conventional CVD techniques are used to create a diamond film on the substrate. The film will either be a full, continuous film which is patterned by stripping the photoresist or a patterned film due to the preferential adsorption to the diamond seeded areas of the photoresist pattern. CVD is a well known technique involving the introduction of particular gases into a chamber where an energy source, such as a hot filament or microwave energy, is used to create a plasma for growing a film on a substrate. For example, to create a diamond film on a silicon substrate prepared as described, a combination of methane/hydrogen/oxygen gas or methanol/hydrogen/oxygen gas is passed over a substrate adjacent to a filament heated to approximately 2000 degrees C., resulting in the formation of a diamond film on the seeded substrate surface. If such a hot filament CVD treatment is used, typical substrate temperatures are in the range from 800 to 1000 degree C. and total gas pressure at 20 to 40 Torr. These conditions produce deposition rates from 1 to 5 microns per hour.

Because of the uniformity of coverage of the diamond seeds on the substrate, the film growth is highly accelerated in comparison to conventional diamond film CVD techniques. Uniform, continuous coverage of the seeded portions of the substrate can be achieved in less than 20 minutes, as opposed to other techniques which do not result in uniform, continuous coverage even after many hours of CVD. The smaller isotropic grains produced by the enhanced CVD method can have a lower surface roughness than that produced by conventional CVD.

EXAMPLE 1

A commercially available silicon wafer was cleaned and baked at 200 degrees C. for 60 minutes in air. The cleaned substrate exposed to hexamethyldisilazane for 5 minutes. One drop of a commercial photoresist (Shipley Microposit S-1400 series) was applied to the substrate by spin coating for 20 seconds. The photoresist coated substrate was baked in air for 30 minutes at 95 degrees C. The silicon wafer was exposed through a mask to ultraviolet light for 45 seconds and then immersed in developer (MF139, Shipley) for 45 seconds. After rinsing with deionized water the developed photoresist was dried using nitrogen gas and then baked at 125 degrees C. for 30 minutes in air.

Figure 2:
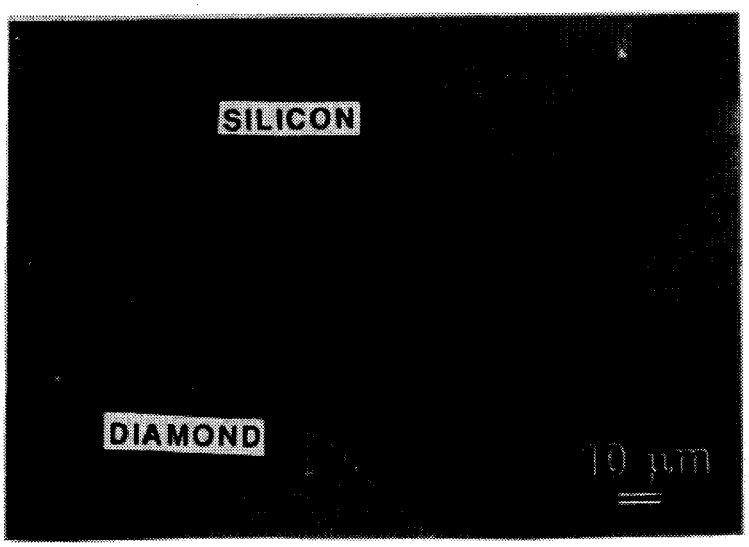
FIG. 2 is an SEM photomicrograph of the diamond seeded silicon substrate of FIG. 1 with the photoresist coating removed.

The photoresist coated silicon wafer was treated in a 5 weight percent polyethyleneimine solution for 3.5 hours, removed and vigorously washed with deionized water. A 2 volume percent aqueous suspension of a commercially available diamond (GE, Series 300, 0–0.5 micron Super Abrasive) was prepared. The silicon wafer was vertically suspended in the colloidal diamond suspension for 2 hours. After removal from the diamond suspension, the wafer was vigorously washed with deionized water and air dried. The surface of the silicon wafer, coated by the photoresist, is now seeded with numerous diamond seed particles, as shown in FIG. 1. The cross-linked photoresist is now stripped by rinsing the substrate with acetone for approximately 2 minutes then air dried. Removal of the cross-linked areas of the photoresist results in a patterned substrate surface, shown in FIG. 2, with well defined areas of unseeded silicon now exposed. The unstripped, seeded photoresist is now ready to provide the basis for creating a patterned diamond film on the substrate.

Figure 3:
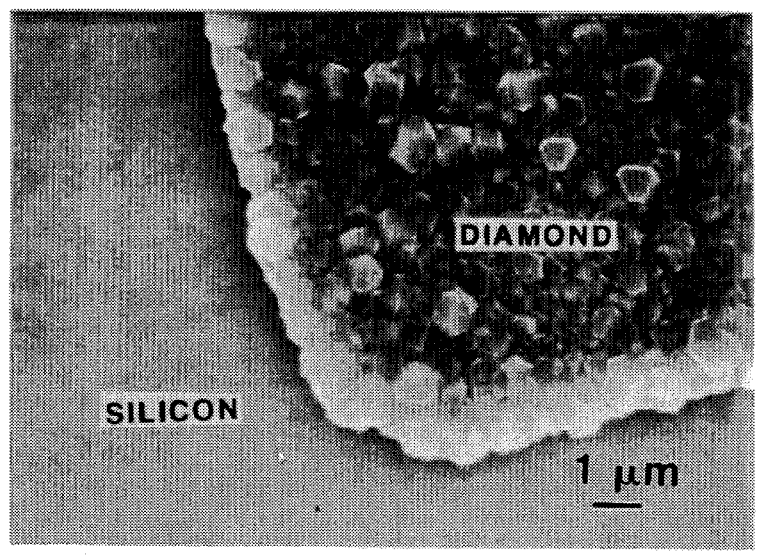
FIG. 3 is an SEM photomicrograph of the silicon substrate of FIGS. 1 and 2 after CVD to create a patterned diamond film.
Figure 4:
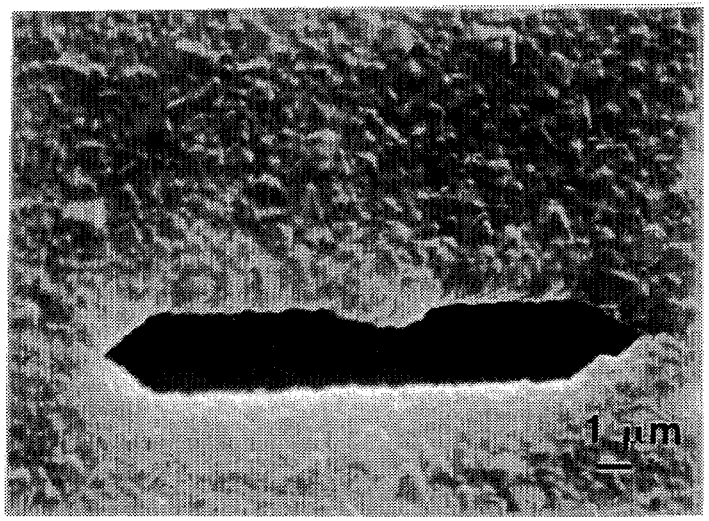
FIG. 4 is an SEM photomicrograph of a different portion of the silicon substrate of FIG. 3 showing a 2 micron resolution in the diamond film pattern.

Hot filament CVD on the substrate is performed for 40 minutes using a tungsten filament approximately 1 cm from the silicon surface in a 1% methane/hydrogen gas mixture with a total pressure of 40 Torr and a starting temperature of approximately 903 degrees C. and a final temperature of approximately 883 degrees C. The diamond film is preferentially adsorbed onto the seeded areas, resulting in a patterned film which leaves exposed the unseeded areas of the silicon wafer where the photoresist was removed. FIG. 3 shows the clear demarcation between the highly uniform diamond film adsorbed onto the seeded photoresist and the unseeded silicon substrate. As shown in FIG. 4, the technique provides for resolution on an order of 2 microns or less.

EXAMPLE 2

A commercially available silicon wafer with spiral inductors was cleaned and baked at 200 degrees C. for 60 minutes in air. The cleaned substrate was exposed to hexamethyldisilazane for 5 minutes. One drop of a commercial photoresist (Shipley Microposit S-1400 series) was applied to the substrate via spin coating for 20 seconds. The photoresist coated substrate was baked for 30 minutes at 95 degrees C. The wafer was exposed through a mask to ultraviolet light for 45 seconds in developer (MF139, Shipley), removed and rinsed with deionized water, dried using nitrogen gas and baked at 125 degrees C. for 30 minutes in air. All areas except spiral inductors and pads were covered with the photoresist.

Figure 5:
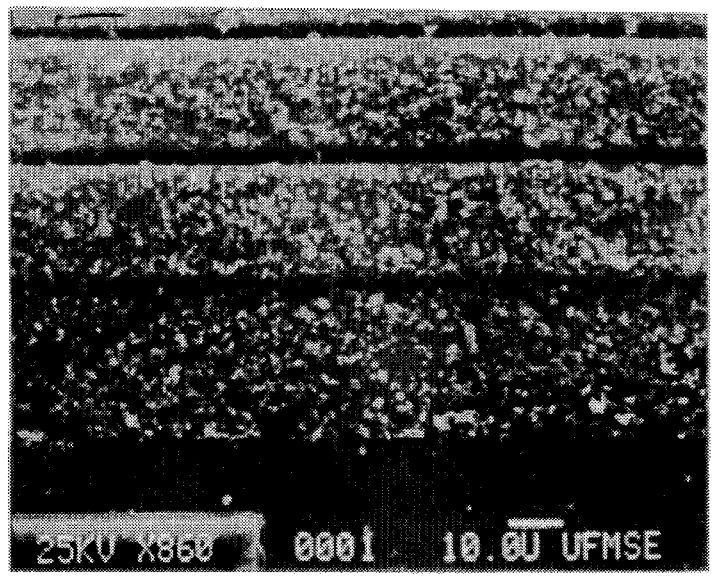
FIG. 5 is an SEM photomicrograph of a ferrite seeded silicon substrate after removal of the photoresist coating.
Figure 6:
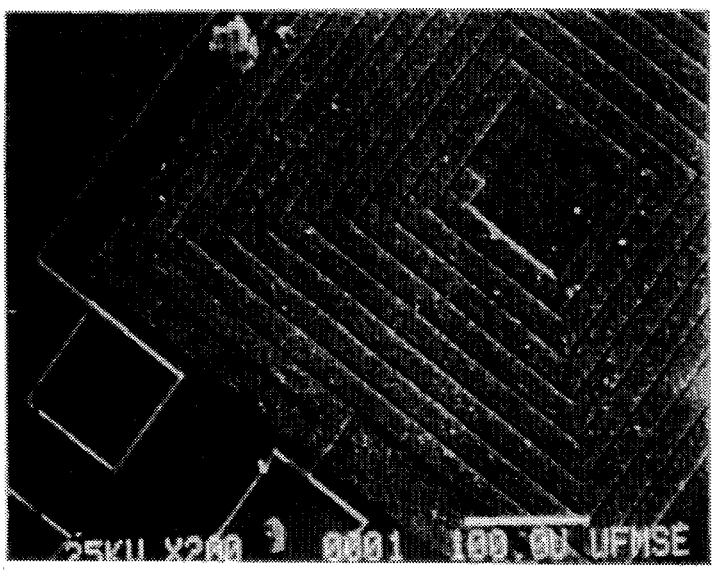
FIG. 6 is an SEM photomicrograph of the ferrite seeded silicon substrate of FIG. 5 shown at lower magnification.

The photoresist coated silicon wafer was treated in 0.6 weight percent polyethyleneimine solution for 24 hours. The wafer was removed and then vigorously washed with deionized water. A 1.5 volume percent aqueous suspension at pH 7.5 of a commercially available ferrite powder (318M, Miles) was prepared. The wafer was suspended in the ferrite suspension for 24 hours, then removed and washed vigorously with deionized water. After air drying, the cross-linked photoresist was stripped by rinsing with acetone for up to 2 minutes, then air dried. Removal of the cross-linked photoresist results in a patterned substrate having clearly demarcated areas of ferrite seeded substrate and areas of unseeded silicon wafer, as shown in FIGS. 5 and 6. This provides a basis for preferential adsorption of a ferrite film in CVD treatment, to provide a patterned film on the silicon substrate.

It is acknowledged that obvious substitutions or equivalents may be known to those skilled in the art. The above examples are by way of illustration only, and the true scope and definition of the invention is to be as set forth in the following claims.

We claim:

1. A method for the formation of a patterned film composed of a high surface energy material on a substrate comprising the steps of:

(A) creating a photomask pattern on a substrate using photolithography, whereby certain areas of the substrate are exposed while the remaining areas are covered by the photomask pattern;

(B) providing the substrate and photomask pattern with a surface charge opposite to the surface charge of particles of a high surface energy material;

(C) removing said photomask pattern from said substrate;

(D) adsorbing said particles onto said substrate by exposing said substrate to an aqueous colloidal suspension of said particles of said high surface energy material;

(E) removing said substrate from said aqueous colloidal suspension; and (F) depositing a film of said high surface energy material onto said substrate and said adsorbed particles by chemical vapor deposition.

2. The method of claim 1, where said step of providing said oppositely charged surface on said substrate comprises chemically adsorbing cations onto said substrate.

3. The method of claim 1, where said step of providing said oppositely charged surface on said substrate comprises adsorbing a cationic polymer onto said substrate.

4. The method of claim 1, where said step of providing said oppositely charged surface on said substrate comprises chemically adsorbing anions onto said substrate.

5. The method of claim 1, where said step of providing said oppositely charged surface on said substrate comprises adsorbing an anionic polymer onto said substrate.

6. The method of claim 1, where said aqueous colloidal suspension comprises from 0.05 to 5.0 volume percent high surface energy particles with diameter of less than 10 microns.

7. The method of claim 6, where said aqueous colloidal suspension comprises said particles with diameter between 0.1 and 0.2 microns.

8. The method of claim 1, where said high surface energy material is diamond.

9. The method of claim 1, where said high surface energy material is a nitride having a surface energy greater than 60 ergs/cm$^2$.

10. The method of claim 1, where said high surface energy material is a boride having a surface energy greater than 60 ergs/cm$^2$.

11. The method of claim 1, where said high surface energy material is an oxide having a surface energy greater than 60 ergs/cm$^2$.

12. The method of claim 3, where said cationic polymer is polyethyleneimine.

13. A method for the formation of a patterned film composed of a high surface energy material on a substrate comprising the steps of:

(A) creating a photomask pattern on a substrate using photolithography, whereby certain areas of the substrate are exposed while the remaining areas are covered by the photomask pattern;

(B) providing said substrate and said photomask pattern with a surface charge opposite to the surface charge of particles of a high surface energy material;

(C) adsorbing said particles onto said substrate and said photomask pattern by exposing said substrate to an aqueous colloidal suspension of said particles of said high surface energy material;

(D) removing said substrate from said aqueous colloidal suspension;

(E) removing said photomask pattern from said substrate; and (F) depositing a film of said high surface energy material onto said substrate and said adsorbed particles by chemical vapor deposition.

14. The method of claim 13, where said step of providing said oppositely charged surface on said substrate comprises chemically adsorbing cations onto said substrate.

15. The method of claim 13, where said step of providing said oppositely charged surface on said substrate comprises adsorbing a cationic polymer onto said substrate.

16. The method of claim 13, where said step of providing said oppositely charged surface on said substrate comprises chemically adsorbing anions onto said substrate.

17. The method of claim 13, where said step of providing said oppositely charged surface on said substrate comprises adsorbing an anionic polymer onto said substrate.

18. The method of claim 13, where said aqueous colloidal suspension comprises from 0.05 to 5.0 volume percent high surface energy particles with diameter of less than 10 microns.

19. The method of claim 18, where said aqueous colloidal suspension comprises said particles with diameter between 0.1 and 0.2 microns.

20. The method of claim 13, where said high surface energy material is diamond.

21. The method of claim 13, where said high surface energy material is a nitride having a surface energy greater than 60 ergs/cm$^2$.

22. The method of claim 13, where said high surface energy material is a boride having a surface energy greater than 60 ergs/cm$^2$.

23. The method of claim 13, where said high surface energy material is an oxide having a surface energy greater than 60 ergs/cm$^2$.

24. The method of claim 15, where said cationic polymer is polyethyleneimine.

* * * * *